(12) United States Patent
Sakota et al.

(10) Patent No.: US 6,388,623 B1
(45) Date of Patent: May 14, 2002

(54) ANTENNA-INTEGRATED MICROWAVE-MILLIMETER WAVE MODULE

(75) Inventors: Naoki Sakota, Sakurai; Atsushi Yamada, Tenri; Koki Kitaoka, Sakurai, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/835,356

(22) Filed: Apr. 17, 2001

(30) Foreign Application Priority Data

Apr. 18, 2000 (JP) ........................................ 2000-116010

(51) Int. Cl.[7] ................................................ H01Q 1/38
(52) U.S. Cl. .............................. 343/700 MS; 343/767; 257/672
(58) Field of Search .......................... 343/700 MS, 767, 343/746, 770, 776, 785, 911 R, 853; 257/672, 676, 677, 508; 333/247; H01Q 1/38

(56) References Cited

U.S. PATENT DOCUMENTS

| | | | | |
|---|---|---|---|---|
| 5,455,594 A | * | 10/1995 | Blasing et al. | ....... 343/700 MS |
| 5,463,404 A | * | 10/1995 | Wall | ..................... 343/700 MS |
| 5,596,336 A | * | 1/1997 | Liu | ............................. 343/770 |
| 5,872,545 A | * | 2/1999 | Rammos | ....................... 343/770 |
| 5,903,239 A | * | 5/1999 | Takahashi et al | .... 343/700 MS |
| 5,926,136 A | * | 7/1999 | Ohtsuka et al. | ....... 343/700 MS |
| 6,114,997 A | * | 9/2000 | Lee et al | ............. 343/700 MS |
| 6,181,278 B1 | * | 1/2001 | Kakimoto et al. | ... 343/700 MS |

OTHER PUBLICATIONS

Hasegawa et al., IECE, vol. 3, p. 109 (1982) w/ Partial Translation.

* cited by examiner

*Primary Examiner*—Don Wong
*Assistant Examiner*—Trinh Vo Dinh (57) ABSTRACT

A microwave circuit or a millimeter wave circuit is formed on a semiconductor chip. A multilayer substrate is formed of a first dielectric layer, a second dielectric layer and a third dielectric layer. A high-frequency circuit line with the semiconductor chip mounted thereon is formed on the third dielectric layer. A slot hole is formed on one side of the second dielectric layer and an antenna feeding line is formed on the other side. The first dielectric layer has a plurality of slot holes formed therein that radiate electromagnetic waves. An organic substrate is laminated to the multilayer substrate by an adhesion layer.

11 Claims, 5 Drawing Sheets

ANTENNA-INTEGRATED MICROWAVE-MILLIMETER WAVE MODULE

BACKGROUND OF THE INVENTION

1. Field of the Invention

The present invention relates to a structure of an antenna-integrated microwave-millimeter wave module and particularly to a microwave-millimeter wave module integrated with a slot antenna having improved antenna efficiency and directivity.

2. Description of the Background Art

With recent increase in information amount, radio communication by high frequencies like microwave and millimeter wave has been attracting attention as high-speed and high-capacity data transmission means. This type of communication requires an antenna and a microwave-millimeter wave circuit that are integrated, i.e., an antenna-integrated microwave-millimeter wave circuit of small size, lightweight and high performance to serve as a transmitter-receiver.

Conventional slot antennas are structured by providing a slot placed opposite an open end of a strip conductor of a microstrip line with a dielectric therebetween and electromagnetically coupling the microstrip line and the slot.

Figure 6:
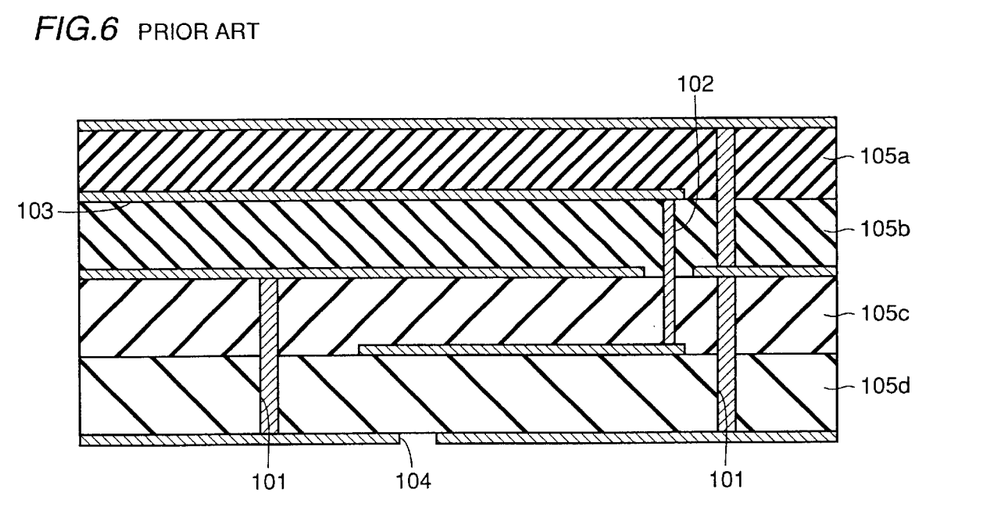
FIGS. 6 and 7 show a cross section of a multilayer substrate illustrating a conventional slot antenna.
Figure 7:
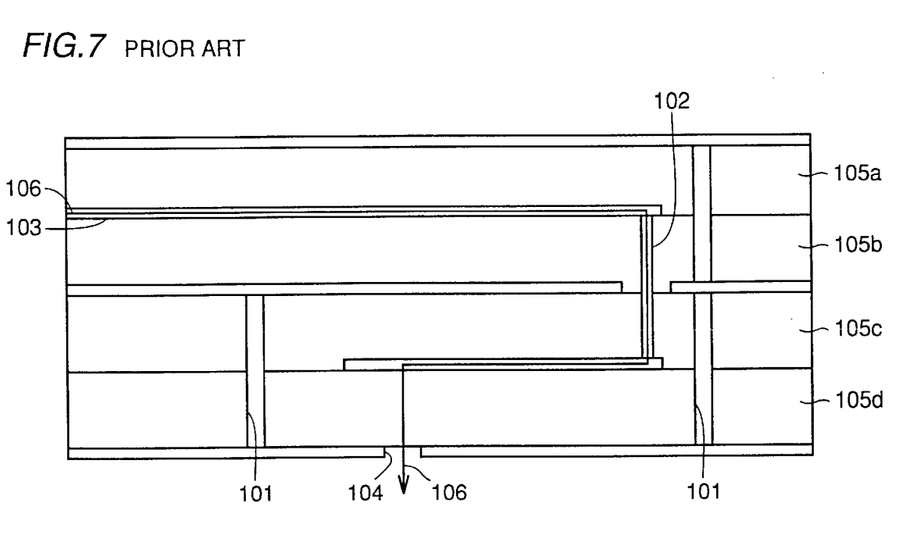

FIGS. 6 and 7 show a cross section of a multilayer substrate illustrating a conventional slot antenna. Referring to FIG. 6, the multilayer substrate includes a through hole 101, a connection conductor 102 of a strip conductor, a stripline 103 of triplet type, a slot hole 104, and dielectric layers 105a–105d. A slot antenna employed as a radiating element and triplet stripline 103 including RF signal circuits are structured to form the multilayer substrate. Referring to FIG. 7, electromagnetic waves are radiated from slot hole 104 via the RF signal circuits as indicated by the arrow 106. Dielectric layers 105a–105d are connected by a large number of through holes 101. A large number of through holes 101 are also provided around the slot antenna (see for example IECE (Institute of Electronics and Communication Engineers) Japan National Conference Record, Vol. 3 (1982) p. 109).

The conventional slot antenna of this type has following disadvantages. Specifically, when an antenna feeding line is integrated with the RF signal circuits to form the multilayer substrate structure, many conductor connections are necessary between substrates. Further, many through holes are also required around the slot hole for connection of ground conductor plates for the purpose of restricting parallel-plate mode. Consequently, a feeding circuit has a complicated structure which makes fabrication thereof extremely difficult.

Although there is an advantage that the system size can be reduced, mismatch of impedance between the slot hole and the space deteriorates antenna efficiency in general.

SUMMARY OF THE INVENTION

The present invention, having been made with these circumstances taken into consideration, aims to provide a high-efficiency, small size and lightweight antenna-integrated microwave-millimeter wave module.

An antenna-integrated microwave-millimeter wave module according to one aspect of the present invention includes a dielectric substrate, a first conductor layer provided on the dielectric substrate and having a plurality of first holes formed therein to radiate electromagnetic waves, a first dielectric layer provided on the first conductor layer, an antenna feeding line provided on the first dielectric layer, a second dielectric layer provided on the antenna feeding line, a second conductor layer provided on the second dielectric layer and having a second hole formed therein, a third dielectric layer provided on the second conductor layer, a high-frequency circuit line provided on the third dielectric layer, and a semiconductor chip connected to the high-frequency circuit line and having a microwave or millimeter wave circuit formed. The first, second and third dielectric layers each have a thickness of $\lambda/4$ or less, $\lambda$ representing wavelength of electromagnetic waves propagating through the dielectric layers, and the first, second and third dielectric layers have a relative dielectric constant of 10 or less.

The antenna-integrated microwave-millimeter wave module having the structure as described above includes the first, second and third dielectric layers each having a thickness of $\lambda/4$ or less and a relative dielectric constant of 10 or lower, and accordingly the high-frequency circuit line and the antenna feeding line are electromagnetically coupled via the second hole. Then, without through hole, high frequency propagating through the high-frequency circuit line is conveyed to the antenna feeding line. The thickness of the first dielectric layer which is $\lambda/4$ or less and the relative dielectric constant thereof which is 10 or less facilitate radiation of the high frequency propagating through the antenna feeding line to the outside via the first holes. Further, the first conductor layer formed on the dielectric substrate allows electromagnetic waves radiated from the first holes to be discharged via the dielectric substrate to the outside. The antenna efficiency can thus be improved by impedance matching between the first dielectric layer and the dielectric substrate.

Preferably, the dielectric substrate and the first conductor layer are laminated by lamination resin and the total thickness of the dielectric substrate and the lamination resin is 0.1 to 0.3 times as large as $\lambda$.

Preferably, the lamination resin contains silicon or fluorine. When the lamination resin contains silicon, the lamination resin includes for example silicone resin.

Preferably, the dielectric substrate has a relative dielectric constant of 2 or more and 4 or less.

An antenna-integrated microwave-millimeter wave module according to another aspect of the invention includes a first conductor layer having a plurality of first holes formed therein to radiate electromagnetic waves, a first dielectric layer provided on the first conductor layer, an antenna feeding line provided on the first dielectric layer, a second dielectric layer provided on the antenna feeding line, a second conductor layer provided on the second dielectric layer and having a second hole formed therein, a third dielectric layer provided on the second conductor layer, a high-frequency circuit line provided on the third dielectric layer and electromagnetically coupled with the antenna feeding line via the second hole, and a semiconductor chip connected to the high-frequency circuit line and having a microwave or millimeter wave circuit formed. The first holes include a feed slot hole fed by the antenna feeding line and a non-feed slot hole not fed by the antenna feeding line, and distance d between the feed slot hole and the non-feed slot hole is approximately $(0.5+n)\lambda$, $\lambda$ representing wavelength of electromagnetic waves propagating through the dielectric layers and n being an integer of at least 1.

The antenna-integrated microwave-millimeter wave module structured as described above includes the high-frequency circuit line and the antenna feeding line that are electromagnetically coupled via the second hole. Then, without through hole, high frequency propagating through the high-frequency circuit line is conveyed to the antenna feeding line to facilitate radiation of electromagnetic waves to the outside via the first holes. Electromagnetic waves that are radiated into the substrate (the dielectric layers) are partially reflected by the second conductor layer. The reflected electromagnetic waves have an inverted phase. The distanced between the feed slot hole and the non-feed slot hole is approximately $(0.5+n)\lambda$. Therefore, electromagnetic waves are radiated from the non-feed slot hole having the same phase as that of electromagnetic waves radiated from the feed slot hole.

Preferably, n is 1.

Preferably, the antenna-integrated microwave-millimeter wave module further includes a dielectric substrate placed opposite the first conductor layer.

Preferably, the dielectric substrate has a relative dielectric constant of 2 or more and 4 or less.

Preferably, the first, second and third dielectric layers each have a thickness of $\lambda/4$ or less, and the first, second and third dielectric layers have a relative dielectric constant of 10 or less.

Preferably, the dielectric substrate and the first conductor layer are laminated by lamination resin and the total thickness of the dielectric substrate and the lamination resin is 0.1 to 0.3 times as large as $\lambda$.

Preferably, the lamination resin contains silicon or fluorine.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention is hereinafter described in conjunction with the drawings. It is noted that components having the same function are denoted by the same reference character through all the drawings and description thereof is not repeated.

According to one embodiment, the present invention is applied to a millimeter module of 60 GHz band.

Figure 1:
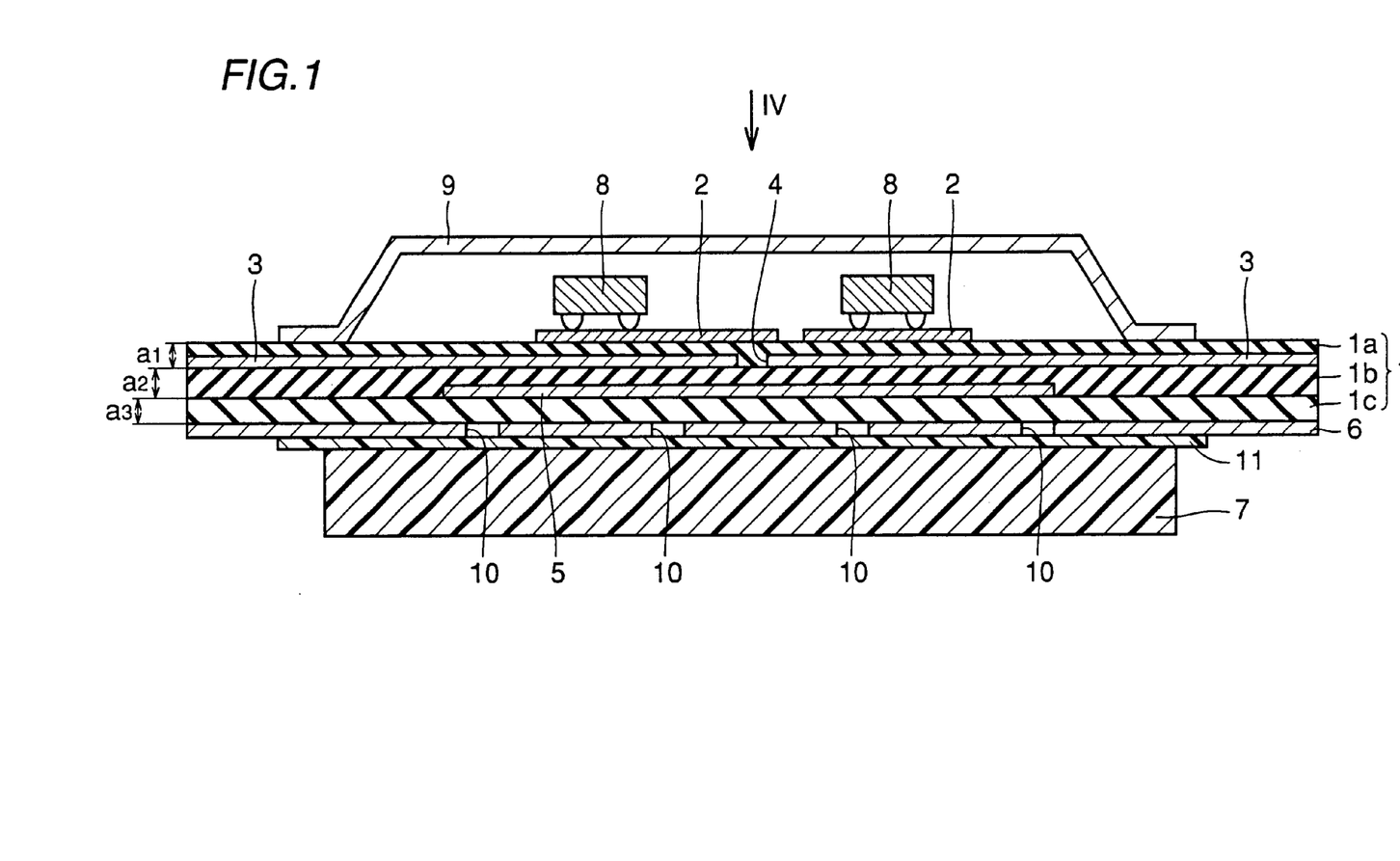
FIGS. 1 and 2 show an embodiment of an antenna-integrated microwave-millimeter wave module according to the present invention.
Figure 2:
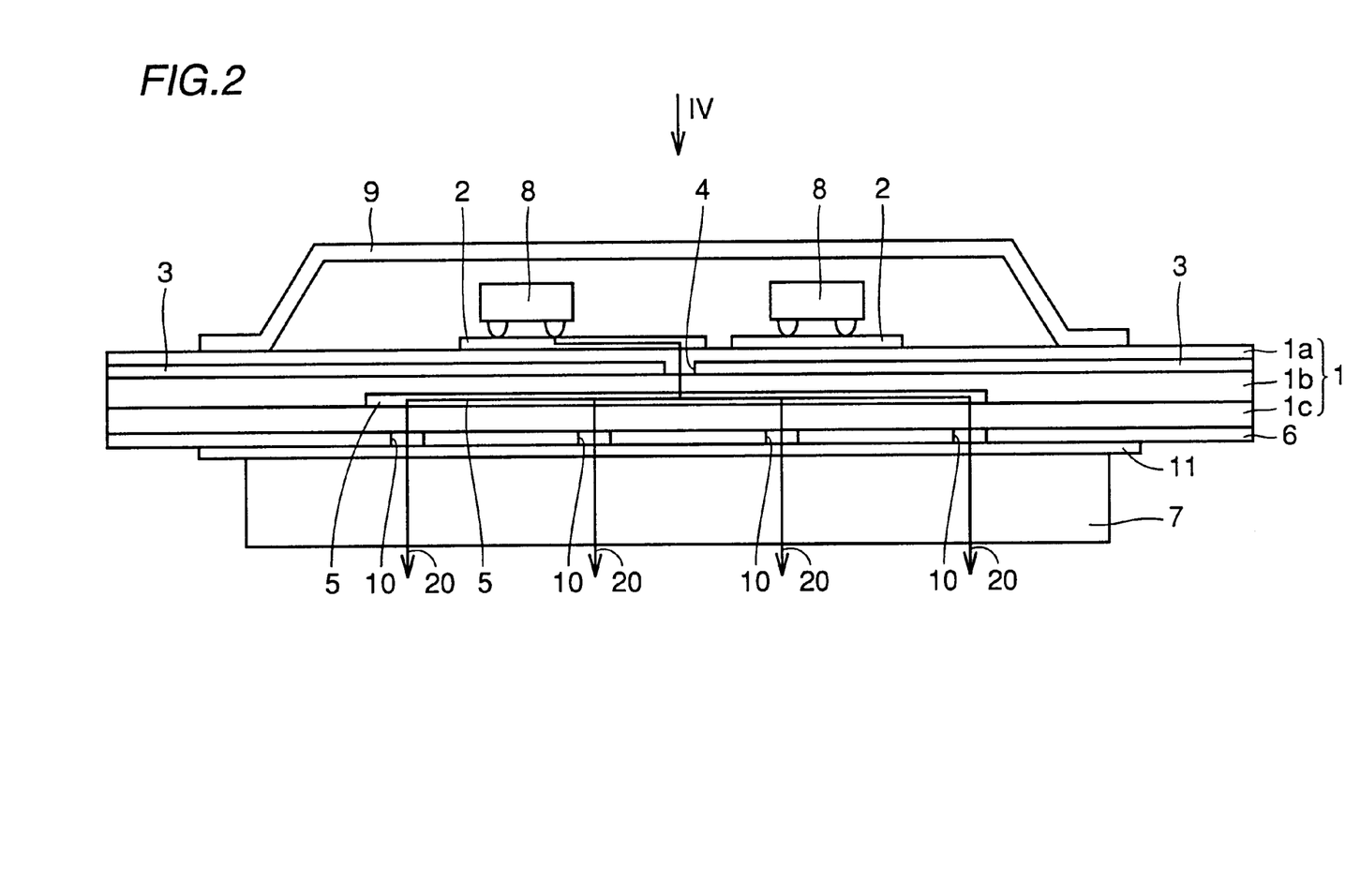
Figure 3:
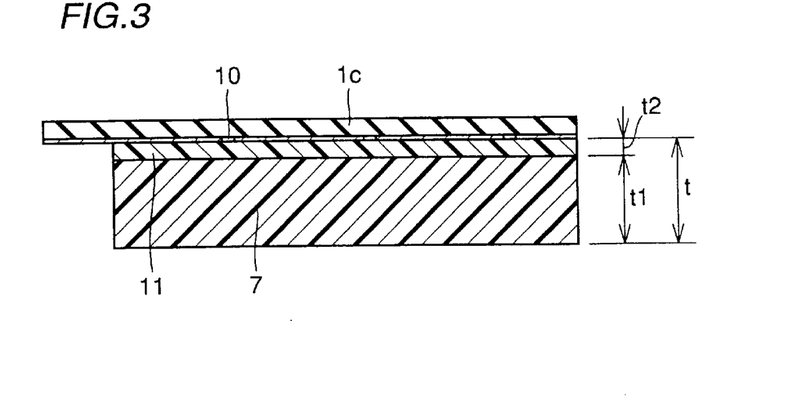
FIG. 3 is an enlarged view of a portion of the module where lamination is made.

Referring to FIGS. 1–3, a first dielectric layer 1c, a second dielectric layer 1b and a third dielectric layer 1a constitute a multilayer substrate 1. To multilayer substrate 1, a high-frequency circuit line (microstrip line) 2, first and second conductor layers 6 and 3, first and second holes 10 and 4 in the shape of slot, an antenna feeding line 5, an organic substrate 7 serving as a dielectric substrate, a semiconductor chip 8, a metal cap 9 and an adhesive layer (resin layer) 11 serving as lamination (bonding) resin are provided.

High-frequency circuit line 2 is formed by gold plating on one surface of the third dielectric layer 1a (first surface of multilayer substrate 1). Conductor layer 6 having a plurality of first holes 10 functioning as antenna elements (e.g. slot holes corresponding to 16 elements, 36 elements and the like) is formed on one surface of the first dielectric layer 1c (second surface of multilayer substrate 1), and, on the other surface thereof (second inner layer of multilayer substrate 1), antenna feeding line 5 for feeding first holes 10 is formed. On one surface of the second dielectric layer 1b (first inner layer of multilayer substrate 1), conductor layer 3 having the second hole 4 is formed on almost the entire surface. Through holes (not shown) are arranged around multilayer substrate 1 for providing DC signals and intermediate-frequency signals from the inside to the outside.

Multilayer substrate 1 is a ceramic substrate with a linear expansion coefficient of 4–10 ppm/°C. Substrate 1 consists of three layers each having a thickness of 150 μm and accordingly has the total thickness of 450 μm. Semiconductor chip 8 is mounted on high-frequency circuit line 2 on the surface layer of multilayer substrate 1 with Au bumps formed by means of ball bonding which is a conventional technique. Semiconductor chip 8 is connected onto multilayer substrate 1 via the Au bumps by flip-chip method employing thermocompression bonding. As this ceramic substrate, a thick-film circuit substrate, a thin-film circuit substrate, a special-function circuit substrate and the like made of alumina ceramics or glass ceramics for example can be employed. The first to third dielectric layers 1c–1a have respective thicknesses $a_3 - a_1$ each equal to or less than a quarter of wavelength $\lambda$ of electromagnetic waves propagating through the dielectric layers. The first to third dielectric layers 1c–1a have a relative dielectric constant of 10 or less.

Metal cap 9 is formed of Kovar or the like having one side clad by a soldering material and thus soldered to multilayer substrate 1.

Organic substrate 7 is formed of organic resin, a composite material formed of organic resin, or the like (specifically fluorine glass substrate or polytetra fluroethylene substrate), having a thickness combined with that of adhesive layer 11 ranging from 350 μm to 800 μm. Organic substrate 7 has a relative dielectric constant preferably from 2 to 4. Organic substrate 7 may be of an organic material shaped into an organic sheet with an adhesive layer.

Antenna feeding line 5, high-frequency circuit line 2 and the first and second holes 10 and 4 provided to multilayer substrate 1 have a positional relation as described below.

Figure 4:
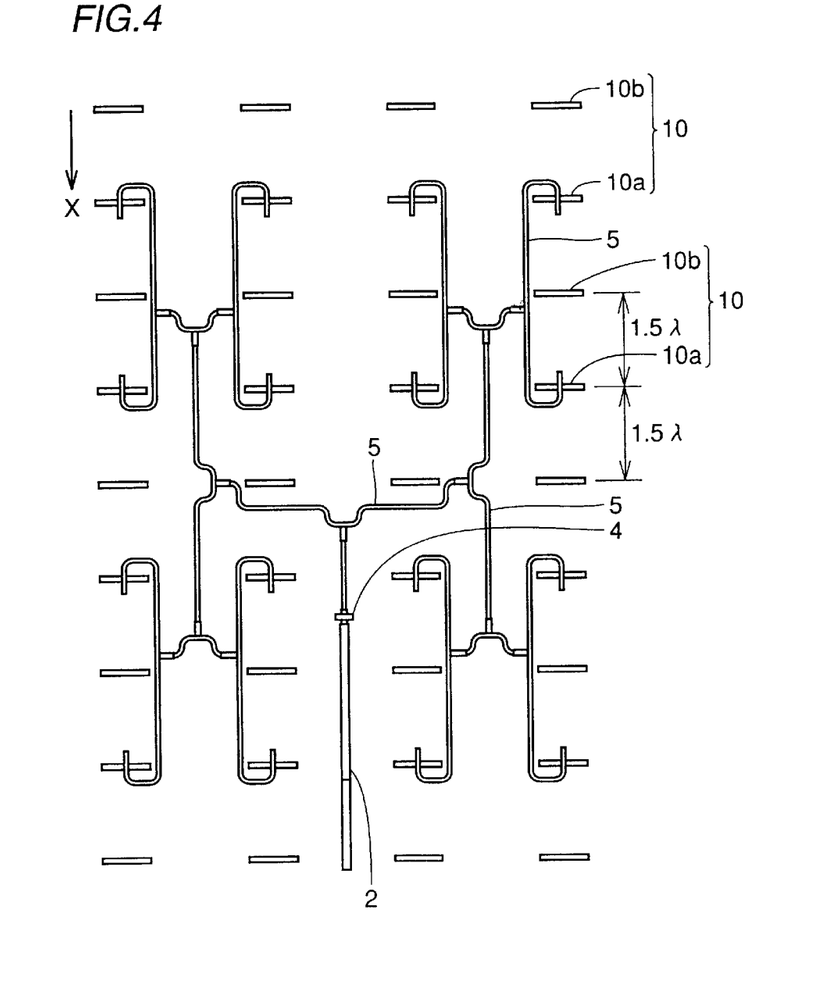
FIG. 4 shows the module in FIG. 1 viewed in the direction of arrow IV to illustrate an arrangement of slot holes, an antenna feeding line and the like shown in FIG. 1.

Referring to FIG. 4, high-frequency circuit line 2 formed on the third dielectric layer 1a and antenna feeding line 5 formed on the first dielectric layer 1c are arranged to overlap, in the direction of the thickness of layers, the second hole 4 formed on the second dielectric layer 1b.

The first hole 10 formed on the first dielectric layer 1c is constituted of a feed slot hole 10a and a non-feed slot hole 10b, and only feed slot hole 10a is arranged to overlap antenna feeding line 5 in the direction of the layer thickness. Namely, only the feed slot hole 10a is fed by antenna feeding line 5.

Feed slot holes 10a and non-feed slot holes 10b are alternately arranged in the direction orthogonal to the direction in which slot holes extend (the direction in which radio waves propagate (direction of X in FIG. 4). A distance set here between the slot holes is approximately 1.5 times as large as wavelength λ of electromagnetic waves propagating through the dielectric layers in multilayer substrate 1 (hereinafter referred to effective wavelength).

By the antenna-integrated module according to this embodiment having the above-discussed structure, RF signals transmitted through high-frequency circuit line 2 connected with semiconductor chip 8 are fed to and accordingly radiated from feed slot holes 10*a* via antenna feeding line 5 by electromagnetic coupling caused by the overlapping structure with the second hole 4.

Electromagnetic waves that are radiated from slot holes 10*a* into the substrate (dielectric layers) leak partially into multilayer substrate 1 to be reflected from conductor layer 3. The leakage of electromagnetic waves is conspicuous in the direction orthogonal to the direction in which feed slot holes 10*a* extend. In addition, the electromagnetic waves have the phase inverted upon reflection from conductor layer 3. There are non-feed slot holes 10*b* located at a distance, which corresponds to the wavelength approximately 1.5 times as large as the effective wavelength within the multilayer substrate, from slot holes 10*a* fed by antenna feeding line 5, and the distance between feed slot holes 10*a* and conductor layer 3 is negligible relative to the effective wavelength. Therefore, the leaking electromagnetic waves are radiated from non-feed slot holes 10*b* with the same phase as that of the waves radiated from feed slot holes 10*a*. Although non-feed slot holes 10*b* are not fed, they function as if feed slot holes 10*a*.

In actual, the leakage electromagnetic waves are supposed to be radiated as non-effective waves from an end of the substrate. However, according to this embodiment, such leakage electromagnetic waves can be radiated as desired electromagnetic waves.

The arrangement as shown in FIG. 4 for example according to this embodiment allows the total number of slots to be 36 elements, the number of feed slot holes 10*a* shown being 16 elements, so that the total number of slot holes as a whole can be at least two times the number of feed slot holes 10*a*. The length of antenna feedingline 5 can be made shorter than the one employed when all of the slot holes should be fed, and accordingly reduction is possible of transmission loss of antenna feeding line 5 and consequently antenna efficiency can be enhanced.

Although the distance between feed slot hole 10*a* and non-feed slot hole 10*b* is herein defined as the length which is approximately 1.5 times greater than effective wavelength λ, the distance is not limited to this definition. The distance can be defined as the one which is approximately (0.5+n) times (n is an integer of at least 0) the effective wavelength within multilayer substrate 1 so as to allow respective phases of electromagnetic waves radiated from respective slot holes to be the same. However, when the distance is approximately 0.5 times the effective wavelength, the spacing between feed slot holes 10*a* is almost equal to the effective wavelength. Then, leakage electromagnetic waves from a certain feed slot hole 10*a* have the phase opposite to that of electromagnetic waves radiated from a feed slot hole 10*a* next to that certain slot hole 10*a*, resulting in weakened electromagnetic waves. The distance between feed slot hole 10*a* and non-feed slot hole 10*b* is thus desirably about (0.5+n) times (n is an integer of at least 1) the effective wavelength. A greater n reduces the amount of radiation from non-feed slots 10*b*. Therefore, the greatest effect can be achieved when n is equal to 1. When the distance between feed slot hole 10*a* and non-feed slot hole 10*b* is (0.5+n) times (n is an integer of at least 1) the effective wavelength, the spacing between feed slot holes 10*a* is approximately (1+2n) times the effective wavelength (e.g. 3 times the wavelength). Then, leakage electromagnetic waves from a certain feed slot hole 10*a* are radiated with phase opposite to that of electromagnetic waves from the feed slot hole 10*a* next to that certain feed slot hole 10*a* as explained above. However, the spacing between feed slot holes 10*a* is 3 times or greater the effective wavelength, the inversion of phase leads to almost no problem.

Organic substrate 7 is now described.

Organic substrate 7 is bonded laminated) to the radiation (of electromagnetic waves) side of multilayer substrate 1 as discussed above by the procedure explained below for example. A dispenser or the like is used first to apply adhesive or resin onto the other side of multilayer substrate 1 with semiconductor chip 8 mounted thereon. Then, onto corners of the other side of the multilayer substrate to be bonded, UV resin for temporal attachment is applied in order to prevent positional displacement, as the adhesive or resin described above. Multilayer substrate 1 with metal cap 9 provided thereto is placed in a recessed part in a stage and attached thereto. Organic substrate 7 is attached to a pressurization tool, alignment of multilayer substrate 1 and organic substrate 7 with respect to each other is established, and accordingly substrates 1 and 7 are bonded (laminated) to each other via adhesive or resin.

The antenna-integrated module according to this embodiment has the second and third dielectric layers 1*b* and 1*a* each having a thickness equal to λ/4 or less, and accordingly high-frequency circuit line 2 and antenna feeding line 5 are electromagnetically coupled. RF signals transmitted through high-frequency circuit line 2 on multilayer substrate 1 are fed to a plurality of slot holes 10 via antenna feeding line 5 because of the electromagnetic coupling accomplished by the overlapping structure with respect to slot hole 4. If there is no organic substrate 7, the impedance of slot holes 10 different from the space impedance, i.e., the impedance mismatch causes reflection of electromagnetic waves that should be radiated directly from slot holes 10 into the space, and thus antenna characteristics are deteriorated. Then, according to this embodiment, organic substrate 7 is bonded to cover all of the slot holes 10 so as to cancel surface waves within the organic substrate that are radiated from respective slot holes 10 thereby enable electromagnetic waves to be radiated into the space efficiently. In this way, electromagnetic waves are radiated as shown in FIG. 2 in the direction indicated by the arrow 20.

Figure 5:
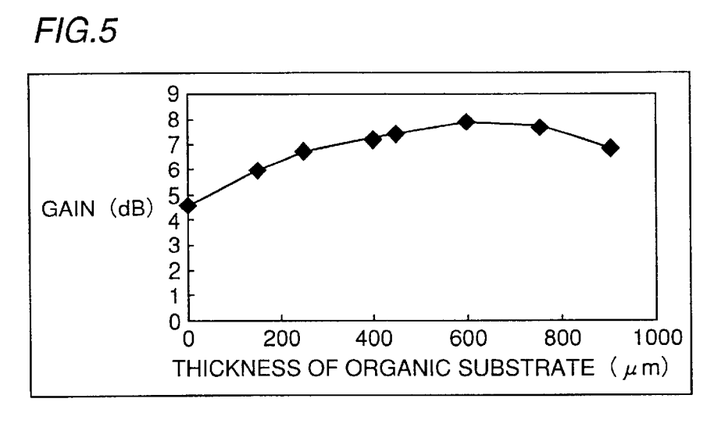
FIG. 5 shows a relation between the thickness of an organic substrate 7 and gain, illustrating a result of a simulation of characteristics of a slot antenna in 60 GHz band, with respect to the thickness of organic substrate 7.

FIG. 5 shows a result of a simulation of characteristics in 60 GHz band exhibited by a slot antenna with respect to the thickness of organic substrate 7. It is understood from this result that the antenna gain attains the maximum value particularly when the thickness of organic substrate 7 is 600 $\mu$m, and accordingly the thickness preferably ranges from approximately 350 $\mu$m to 800 $\mu$m. Actually, the thickness of adhesive layer (resin layer) 11 used for bonding affects the antenna characteristics. Therefore, the total thickness of organic substrate 7 and adhesive layer 11 constituting the module desirably ranges from 350 $\mu$m to 800 $\mu$m (0.1 to 0.3 times as large as the effective wavelength within organic substrate 7). Adhesive layer 11 is considerably thinner than organic substrate 7. Therefore, it is herein assumed that adhesive layer 11 has its characteristics regarding refractive index and the like that are equivalent to those of organic substrate 7.

When organic substrate 7 and multilayer substrate 1 having respective coefficients of linear expansion different by one digit are integrated, warping usually occurs that is 10 $\mu$m or greater per 25 mm. According to this embodiment, for the purpose of preventing the occurrence of warping, silicone-based resin is employed as adhesive layer 11 for attaching organic substrate 7 to multilayer substrate 1, and the adhesive layer 11 has a thickness of 25 $\mu$m to 100 $\mu$m. Then, no excessive load is imposed on the mounted semiconductor chip and accordingly a highly reliable module can be achieved. In addition, substrates can be attached to each other with a low pressure.

Further improvements are possible of antenna characteristics by employing adhesive or resin having a small dielectric constant such as fluorine-based resin, for example, adhesive or resin having a dielectric constant of 3.5 or smaller.

Referring to FIG. 1, an antenna-integrated microwave-millimeter wave module according to the present invention includes an organic substrate 7, a first conductor layer 6 provided on organic substrate 7 and having a plurality of first holes 10 formed therein to radiate electromagnetic waves, a first dielectric layer 1c provided on the first conductor layer 6, an antenna feeding line 5 provided on the first dielectric layer 1c, a second dielectric layer 1b provided on antenna feeding line 5, a second conductor layer 3 provided on the second dielectric layer 1b and having a second hole 4 formed therein, a third dielectric layer 1a provided on the second conductor layer 3, a high-frequency circuit line 2 provided on the third dielectric layer 1a, and a semiconductor chip 8 connected to high-frequency circuit line 2 and having a microwave or millimeter wave circuit formed. The first, second and third dielectric layers 1c, 1b and 1a each have a thickness of $\lambda/4$ or less, $\lambda$ representing wavelength of electromagnetic waves propagating through the dielectric layers, and the first, second and third dielectric layers 1c, 1b and 1a have a relative dielectric constant of 10 or less.

Preferably, organic substrate 7 and the first conductor layer 6 are laminated by a resin layer 11 and the total thickness of organic substrate 7 and resin layer 11 is 0.1 to 0.3 times as large as $\lambda$.

Preferably, resin layer 11 contains silicon or fluorine.

Referring to FIGS. 1 and 4, an antenna-integrated microwave-millimeter wave module according to the invention includes a first conductor layer 6 having a plurality of first holes 10 formed therein to radiate electromagnetic waves, a first dielectric layer 1c provided on the first conductor layer 6, an antenna feeding line 5 provided on the first dielectric layer 1c, a second dielectric layer 1b provided on antenna feeding line 5, a second conductor layer 3 provided on the second dielectric layer 1b and having a second hole 4 formed therein, a third dielectric layer 1a provided on the second conductor layer 3, a high-frequency circuit line 2 provided on the third dielectric layer 1a and electromagnetically coupled with antenna feeding line 5 via the second hole 4, and a semiconductor chip 8 connected to high-frequency circuit line 2 and having a microwave or millimeter wave circuit formed. The first holes 10 include a feed slot hole 10a fed by antenna feeding line 5 and a non-feed slot hole 10b not fed by antenna feeding line 5, and distance d between feed slot hole 10a and non-feed slot hole 10b is approximately $(0.5+n) \lambda$, $\lambda$ representing wavelength of electromagnetic waves propagating through the dielectric layers and n being an integer of at least 1.

Preferably, n is 1.

Preferably, the antenna-integrated microwave-millimeter wave module further includes an organic substrate 7 placed opposite the first conductor layer 6.

Preferably, the first, second and third dielectric layers 1c, 1b and 1a each have a thickness of $\lambda/4$ or less, $\lambda$ representing wavelength of electromagnetic waves propagating through the dielectric layers, and the first, second and third dielectric layers 1c, 1b and 1a have a relative dielectric constant of 10 or less.

Preferably, organic substrate 7 and the first conductor layer 6 are laminated by a resin layer 11 and the total thickness of organic substrate 7 and resin layer 11 is 0.1 to 0.3 times as large as $\lambda$.

Preferably, resin layer 11 contains silicon or fluorine.

Example 1

Alumina ceramic with a relative dielectric constant of 8.9 was used as multilayer substrate 1 formed of ceramic with a dielectric constant of 4–10, high-frequency circuit line 2, conductor layer 3 having the second hole 4 and antenna feeding line 5 were formed by simultaneous firing of tungsten metallization, and thereafter the surfaces of high-frequency circuit line 2 and conductor layer 6 were gold-plated. Silicone resin (dielectric constant 3.1) was employed as adhesive (resin) to be applied onto the surface of a plurality of slot holes 10. Samples with the thickness of adhesive (resin) varied and samples with the thickness of the organic substrate varied were thus prepared.

It is noted that the thickness of adhesive (resin) can be controlled by adjusting pressurizing conditions in lamination of the multilayer substrate and the organic substrate or in curing of the resin. According to this example, samples with adhesive layer (resin layer) 11 of 25 $\mu$m and 100 $\mu$m in thickness were prepared.

Samples were actually produced by laminating multilayer substrate 1 and organic substrate 7. Resultant measurements are shown in Table 1.

TABLE 1

| thickness of organic substrate 7: t1 in FIG. 3 ($\mu$m) | thickness of adhesive layer 11: t2 in FIG. 3 ($\mu$m) | total thickness: t in FIG. 3 ($\mu$m) | relative gain of antenna (dB) |
|---|---|---|---|
| 350 | 25 | 375 | 7.5 |
|  | 100 | 450 | 8 |
| 450 | 25 | 475 | 8.5 |
|  | 100 | 550 | 11 |
| 600 | 25 | 625 | 11.5 |
|  | 100 | 700 | 8 |
| no lamination | — | — | 0 |

As seen from Table 1, a highly efficient antenna can be manufactured by bonding organic substrate 7 onto a plurality of slot holes 10. In particular, the maximum gain was achieved when the total thickness (thickness of organic substrate+ thickness of adhesive layer) was 625 $\mu$m.

Example 2

Samples were actually prepared as Example 1 by employing, as adhesive (resin) to be applied onto the surface of a plurality of slot holes 10, fluorine-based resin having a smaller dielectric constant (2.9) than that of silicone resin and laminating multilayer substrate 1 and organic substrate 7. Resultant measurements are shown in Table 2.

TABLE 2

| thickness of organic substrate 7: t1 in FIG. 3 (μm) | thickness of adhesive layer 11: t2 in FIG. 3 (μm) | total thickness: t in FIG. 3 (μm) | relative gain of antenna (dB) |
|---|---|---|---|
| 450 | 100 | 550 | 17 |
| 600 | 100 | 700 | 14 |
| no lamination | — | — | 0 |

It can be understood from comparison between Table 1 and Table 2 that a higher efficiency can be achieved by employing the fluorine-based resin (resin containing fluorine) having a lower dielectric constant as shown in Table 2 with respect to the same thickness of organic substrate 7 (450 μm, 600 μm) and the same thickness of the adhesive layer (100 μm).

The foregoing discussion on this embodiment does not limit the present invention to a particular form herein described. For example, the invention is applicable to any frequency band except for 60 GHz band. In particular, for the frequency band ranging from 50 to 70 GHz, the structure as heretofore described can be employed to achieve the same effect as that of the embodiment discussed above. Further, any module structure different from that shown in FIG. 1 may alternatively be employed. Although slot holes 10 shown in FIG. 4 are provided for feeding of 16 elements, another number of elements could enable the same effect to be accomplished. In addition, the alternating arrangement of feed slot holes 10a and non-feed slot holes 10b may be replaced with another arrangement by which two non-feed slot holes 10b are provided between feed-slot holes 10a next to each other in the direction orthogonal to the direction in which slot holes 10 extend.

According to the present invention, the efficiency of a slot antenna can be enhanced by lamination with an organic substrate and by definition of the total thickness including the thickness of an adhesive layer. A highly efficient slot antenna can thus be produced. An antenna-integrated microwave-millimeter wave module having superior characteristics can accordingly be provided.

Further, transmission loss of an antenna feeding line can be reduced by the structure of slot holes consisting of feed slot holes and non-feed slot holes and thus the antenna efficiency can be improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An antenna-integrated microwave-millimeter wave module comprising:
   a dielectric substrate;
   a first conductor layer provided on said dielectric substrate and having a plurality of first holes formed therein to radiate electromagnetic waves;
   a first dielectric layer provided on said first conductor layer;
   an antenna feeding line provided on said first dielectric layer;
   a second dielectric layer provided on said antenna feeding line;
   a second conductor layer provided on said second dielectric layer and having a second hole formed therein;
   a third dielectric layer provided on said second conductor layer;
   a high-frequency circuit line provided on said third dielectric layer; and
   a semiconductor chip connected to said high-frequency circuit line and having a microwave or millimeter wave circuit formed,
   said first, second and third dielectric layers each having a thickness of λ/4 or less, λ representing wavelength of electromagnetic waves propagating through the dielectric layers, and
   said first, second and third dielectric layers having a relative dielectric constant of 10 or less.

2. The antenna-integrated microwave-millimeter wave module according to claim 1, wherein
   said dielectric substrate and said first conductor layer are laminated by lamination resin, and the total thickness of said dielectric substrate and said lamination resin is 0.1 to 0.3 times as large as said λ.

3. The antenna-integrated microwave-millimeter wave module according to claim 2, wherein
   said lamination resin contains silicon or fluorine.

4. The antenna-integrated microwave-millimeter wave module according to claim 1, wherein
   said dielectric substrate has a relative dielectric constant of 2 or more and 4 or less.

5. An antenna-integrated microwave-millimeter wave module comprising:
   a first conductor layer having a plurality of first holes formed therein to radiate electromagnetic waves;
   a first dielectric layer provided on said first conductor layer;
   an antenna feeding line provided on said first dielectric layer;
   a second dielectric layer provided on said antenna feeding line;
   a second conductor layer provided on said second dielectric layer and having a second hole formed therein;
   a third dielectric layer provided on said second conductor layer;
   a high-frequency circuit line provided on said third dielectric layer and electromagnetically coupled with said antenna feeding line via said second hole; and
   a semiconductor chip connected to said high-frequency circuit line and having a microwave or millimeter wave circuit formed,
   said first holes including a feed slot hole fed by said antenna feeding line and a non-feed slot hole not fed by said antenna feeding line, and
   distance d between said feed slot hole and said non-feed slot hole being approximately (0.5+n) λ, λ representing wavelength of electromagnetic waves propagating through the dielectric layers and n being an integer of at least 1.

6. The antenna-integrated microwave-millimeter wave module according to claim 5, wherein
   said n is 1.

7. The antenna-integrated microwave-millimeter wave module according to claim 5, further comprising a dielectric substrate placed opposite said first conductor layer.

8. The antenna-integrated microwave-millimeter wave module according to claim 7, wherein
   said dielectric substrate has a relative dielectric constant of 2 or more and 4 or less.

9. The antenna-integrated microwave-millimeter wave module according to claim 5, wherein said first, second and third dielectric layers each have a thickness of $\lambda/4$ or less, and said first, second and third dielectric layers have a relative dielectric constant of 10 or less.

10. The antenna-integrated microwave-millimeter wave module according to claim 5, wherein said dielectric substrate and said first conductor layer are laminated by said lamination resin and the total thickness of said dielectric substrate and said lamination resin is 0.1 to 0.3 times as larger as said $\lambda$.

11. The antenna-integrated micro-millimeter wave module according to claim 10, wherein said lamination resin contains silicon or fluorine.

* * * * *